(12) United States Patent
Wan et al.

(10) Patent No.: US 8,473,809 B2
(45) Date of Patent: Jun. 25, 2013

(54) DATA CODING FOR IMPROVED ECC EFFICIENCY

(75) Inventors: Jun Wan, San Jose, CA (US); Alex Mak, Los Altos Hills, CA (US); Tien-Chien Kuo, Sunnyvale, CA (US); Yan Li, Milpitas, CA (US); Jian Chen, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 438 days.

(21) Appl. No.: 12/839,237

(22) Filed: Jul. 19, 2010

(65) Prior Publication Data

US 2011/0126080 A1    May 26, 2011

Related U.S. Application Data

(60) Provisional application No. 61/263,208, filed on Nov. 20, 2009.

(51) Int. Cl.
*G06F 11/00* (2006.01)
*G11C 29/00* (2006.01)
*G11C 7/00* (2006.01)

(52) U.S. Cl.
USPC ........... 714/763; 714/703; 714/718; 365/200; 365/201; 365/204

(58) Field of Classification Search
None
See application file for complete search history.

(56) References Cited

U.S. PATENT DOCUMENTS

| | | | |
|---|---|---|---|
| 7,012,835 B2 * | 3/2006 | Gonzalez et al. | 365/185.11 |
| 7,224,607 B2 * | 5/2007 | Gonzalez et al. | 365/185.11 |
| 7,310,347 B2 | 12/2007 | Lasser | |
| 8,059,456 B2 * | 11/2011 | Shlick et al. | 365/185.03 |
| 2005/0213393 A1 | 9/2005 | Lasser | |
| 2008/0084752 A1 * | 4/2008 | Li et al. | 365/185.19 |
| 2008/0094911 A1 * | 4/2008 | Chan | 365/185.22 |
| 2008/0104312 A1 | 5/2008 | Lasser | |
| 2008/0137414 A1 | 6/2008 | Park et al. | |
| 2008/0158948 A1 | 7/2008 | Sharon et al. | |
| 2008/0259684 A1 * | 10/2008 | Shlick et al. | 365/185.03 |
| 2009/0207656 A1 * | 8/2009 | Kuo et al. | 365/185.03 |
| 2010/0027351 A1 * | 2/2010 | Seol | 365/185.24 |

FOREIGN PATENT DOCUMENTS

WO    2008011440 A2    1/2008

OTHER PUBLICATIONS

International Search Report & The Written Opinion of the International Searching Authority dated Mar. 14, 2011, Patent Cooperation Treaty, PCT Application No. PCT/US2010/056900, filed Nov. 16, 2010.

* cited by examiner

*Primary Examiner* — Guerrier Merant
(74) *Attorney, Agent, or Firm* — Vierra Magen Marcus LLP

(57) ABSTRACT

Non-volatile storage devices and techniques for operating non-volatile storage are described herein. One embodiment includes accessing "n" pages of data to be programmed into a group of non-volatile storage elements. The "n" pages are mapped to a data state for each of the non-volatile storage elements based on a coding scheme that evenly distributes read errors across the "n" pages of data. Each of the non-volatile storage elements in the group are programmed to a threshold voltage range based on the data states to which the plurality of pages have been mapped. The programming may include programming the "n" pages simultaneously. In one embodiment, mapping the plurality of pages is based on a coding scheme that distributes a significant failure mode (for example, program disturb errors) to a first of the pages and a significant failure mode (for example, data retention errors) to a second of the pages.

26 Claims, 12 Drawing Sheets

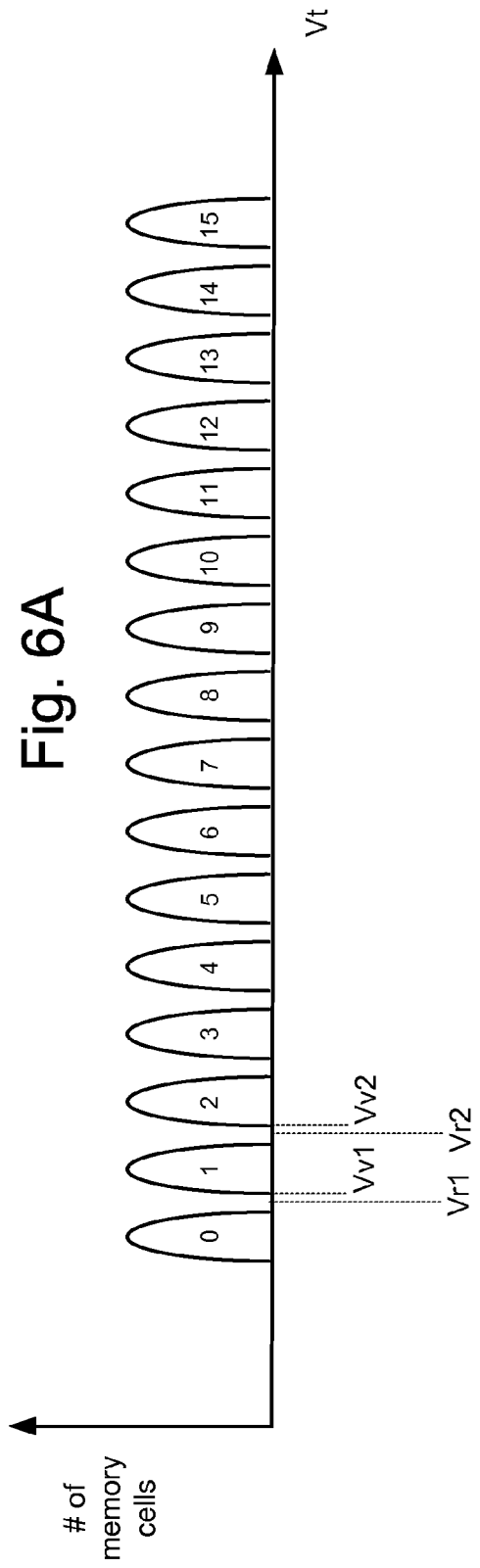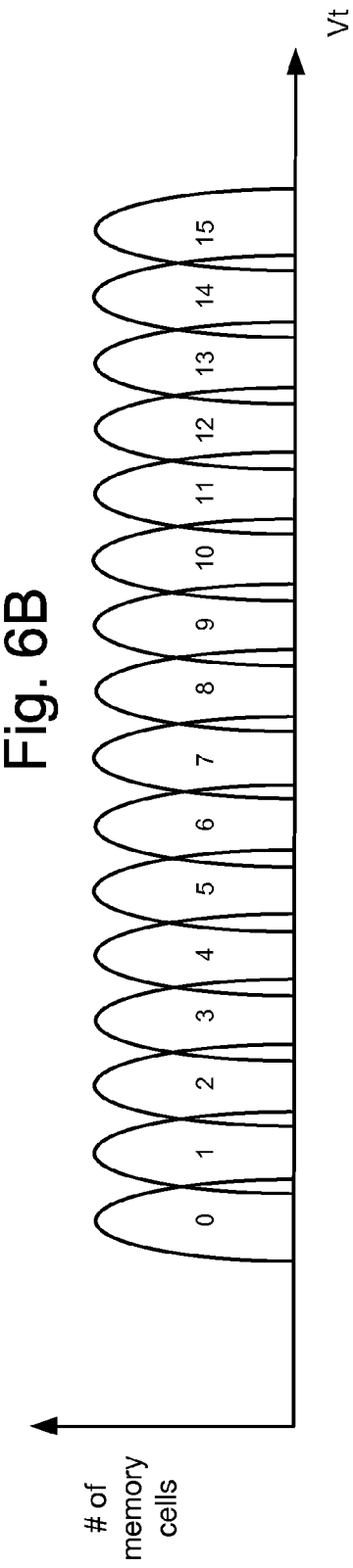

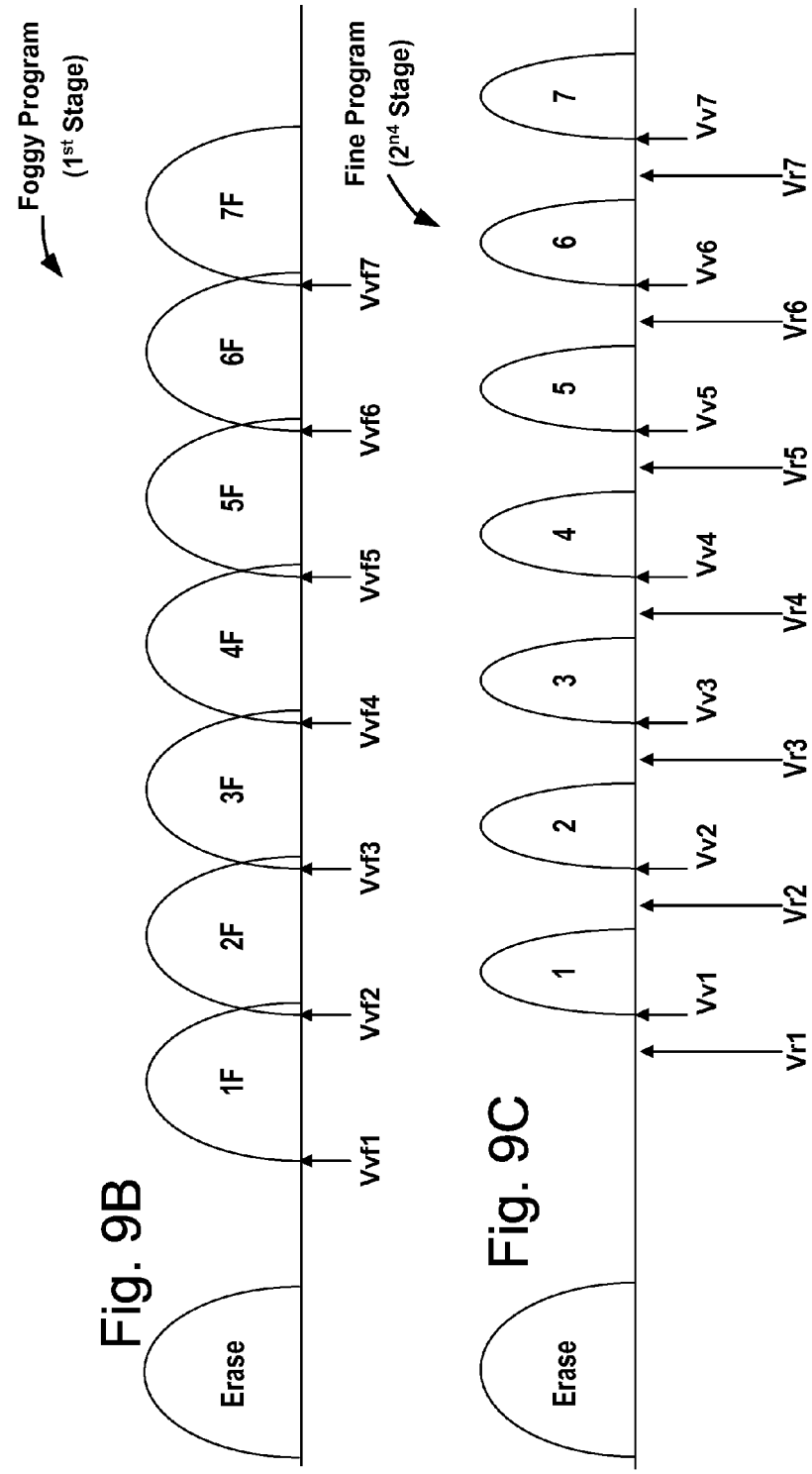

DATA CODING FOR IMPROVED ECC EFFICIENCY

PRIORITY

This application claims the benefit of U.S. Provisional Application No. 61/263,208, entitled "Data Coding for Improved ECC Efficiency," by Jun Wan et al., filed on Nov. 20, 2009, incorporated herein by reference.

BACKGROUND

1. Field

This disclosure relates to technology for non-volatile storage.

2. Description of the Related Art

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

Some EEPROM and flash memory devices have a floating gate that is used to store two ranges of charges and, therefore, the memory cell can be programmed/erased between two states (an erased state and a programmed state). Such a flash memory device is sometimes referred to as a binary memory device.

A multi-state memory device stores multiple bits of data per memory cell by identifying multiple distinct valid threshold voltage (Vt) distributions (or data states). Each distinct Vt distribution corresponds to a predetermined value for the set of data bits encoded in the memory device. For example, a memory cell that stores two bits of data uses four valid Vt distributions. A memory cell that stores three bits of data uses eight valid Vt distributions.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time.

Consequently, it is possible to encounter erroneous or corrupted data bits at the time of reading non-volatile memory. Typically, some form of error checking and correction algorithm ("correction algorithm") is applied to check for and correct any corrupted data bits. One correction algorithm stores additional parity bits to set the parity of a group of data bits to a required logical level during the write process. The additional parity bits are sometimes referred to as an Error Correction Code (ECC). During the read process, the correction algorithm decodes the bits by computing the parity of the group of data bits to detect any corrupted data. The correction algorithm corrects data that is not too severely corrupted. However, if the data is too severely corrupted the ECC code may not be able to correct the data.

BRIEF DESCRIPTION OF THE DRAWINGS

FIG. 6A depicts an example set of Vt distributions.
FIG. 6B depicts an example set of Vt distributions.
FIG. 9A depicts one embodiment of a Vt distribution after memory cells are erased.
FIG. 9B depicts one embodiment of Vt distributions after a foggy program stage.
FIG. 9C depicts one embodiment of Vt distributions after a fine program stage.

DETAILED DESCRIPTION

Figure 1:
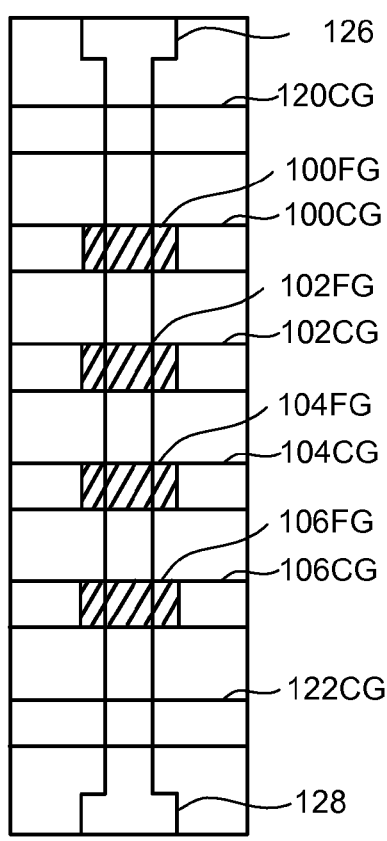
FIG. 1 is a top view of a NAND string.

Techniques are disclosed for improvements in ECC efficiency in non-volatile storage devices. Some non-volatile storage devices store data in multi-bits per non-volatile element. For example, three bits may be stored per non-volatile storage element by programming the element to one of eight different data states. The target threshold voltage to which the non-volatile storage element is programmed is different for each data state. Between the time that a non-volatile storage element is programmed and the time that it is read, its threshold voltage may change for a variety of reasons. Two reasons that may lead to a change in the threshold voltage are program disturb (PD) and data retention (DR). Program disturb refers to a problem in which after the non-volatile storage element is programmed, its threshold voltage is disturbed (e.g., raised or lowered) by programming a neighbor non-volatile storage element. Data retention refers to a problem in which charge stored on the non-volatile storage element transfers (e.g., leaks) to or from the non-volatile storage element. Note that storing a charge on the non-volatile storage element could refer to adding charge or removing charge. For example, electrons can be added to a floating gate to program the non-volatile storage element. However, in some cases, electrons can be removed from a floating gate to program the non-volatile storage element. Data retention problem refers to electrons leaking from (or to) the floating gate over time. This leakage of electrons causes the threshold voltage to change.

Some memory arrays are programmed in units of data, which may be referred to as pages. For example, one or more pages of user data may be stored in one row of memory cells. In some memory arrays, memory cells may store one bit of each page. For example, a given memory cell might store three bits—one bit from each of three pages. In some embodiments, terms such as "a lower page", "a middle page" and "an upper page" may be used to refer to three pages of user data that are stored in the memory cells. Thus, a given memory cell might store one bit from the lower page, one bit from the middle page, and one bit form the upper page. Some of the memory cells may contain an Error Correction Code (ECC) that has been calculated from the user data. In some embodiments, there is a separate set of ECC bits for each page of user data. Thus, note that a group of memory cells that store three pages of user data may be associated with three sets of ECC bits—one for each page.

In one embodiment, non-volatile storage elements are programmed using a coding scheme that spreads the likelihood of read errors evenly to different bits (or pages). Data is physically stored in the non-volatile storage elements using this coding scheme. In other words, the coding scheme refers to the physical data states to which the non-volatile storage elements are programmed. As one example, the coding scheme can be set up such that errors due to program disturb are significantly more likely to occur when reading the upper bit (or page), whereas errors due to data retention are significantly more likely to occur when reading the middle bit (or page). Coding in such a way can relieve the burden on ECC algorithms. For example, if errors due to both program disturb and data retention were significantly more likely to happen when reading the upper bits (or page) than when reading the middle bits (or page), then the ECC bits for the upper bits (or page) are more heavily burdened than the ECC bits for the middle bits (or page). However, embodiments code in a way to spread the ECC burden to different sets of ECC bits.

In some embodiments, the coding scheme improves efficiency by reducing the maximum number of reads that need to be performed when reading any giving page. For example, in one embodiment, reading three pages of data involves reading in a sequence in which a first page is read by reading at a single read compare point, a second page is read by reading at three read compare points, and a third page is read by reading at three read compare points. In one embodiment, reading three pages of data involves reading in a sequence in which a first of the pages is read by reading at two read compare points, a second of the pages is read by reading at two read compare points, and a third of the pages is read by reading at three read compare points. Therefore, a maximum of three reads are needed for any of the pages.

In some embodiment, the non-volatile storage elements are within a flash memory array. One example of a flash memory system uses the NAND structure, which includes arranging multiple transistors in series, sandwiched between two select gates. The transistors in series and the select gates are referred to as a NAND string. The NAND structure will be described as one example architecture; however, techniques described herein are not limited to the NAND architecture.

Figure 2:
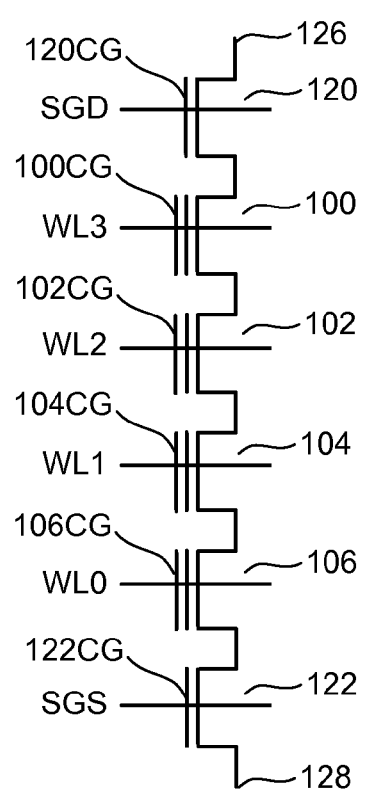
FIG. 2 is an equivalent circuit diagram of the NAND string.

FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with embodiments. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
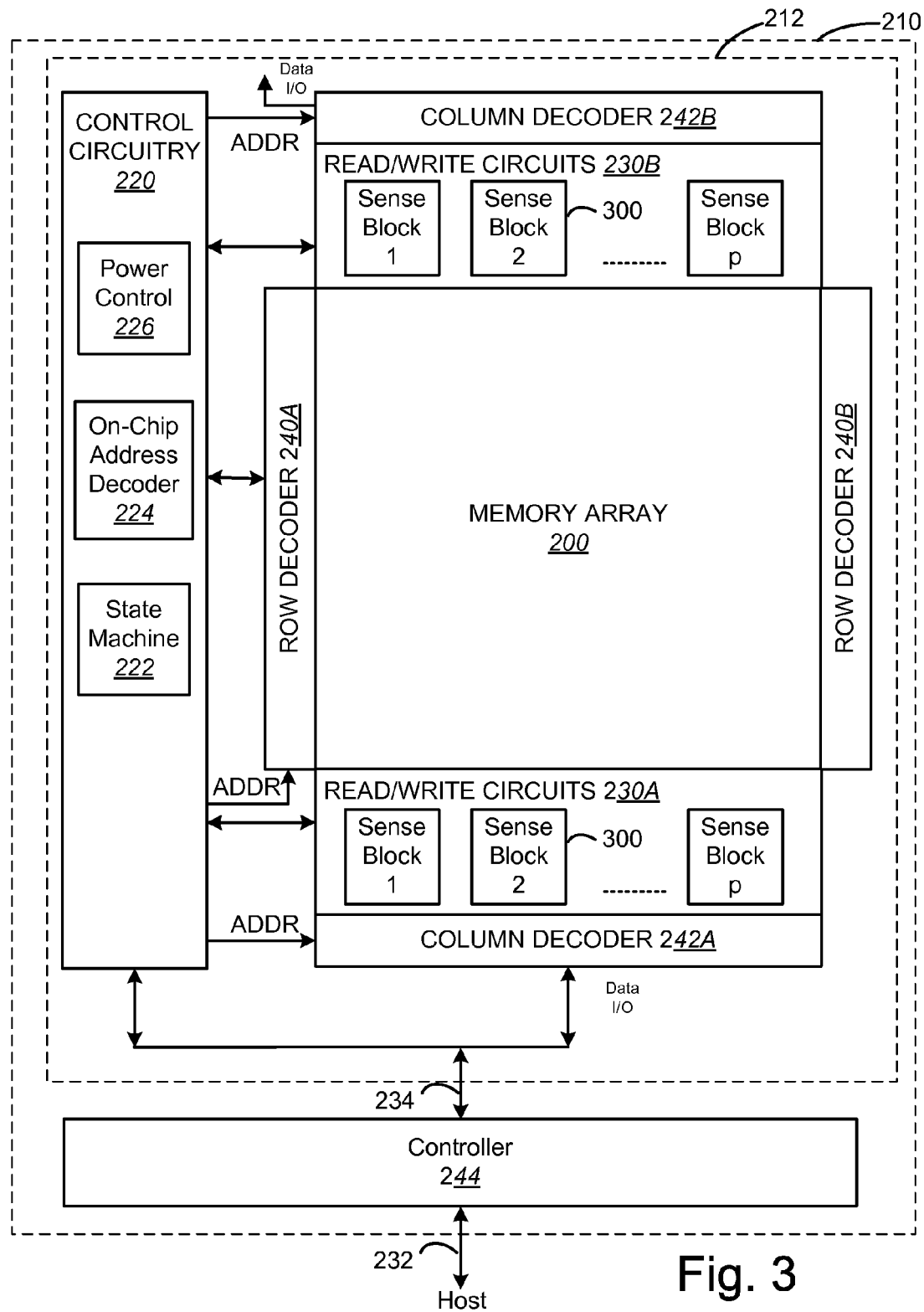
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
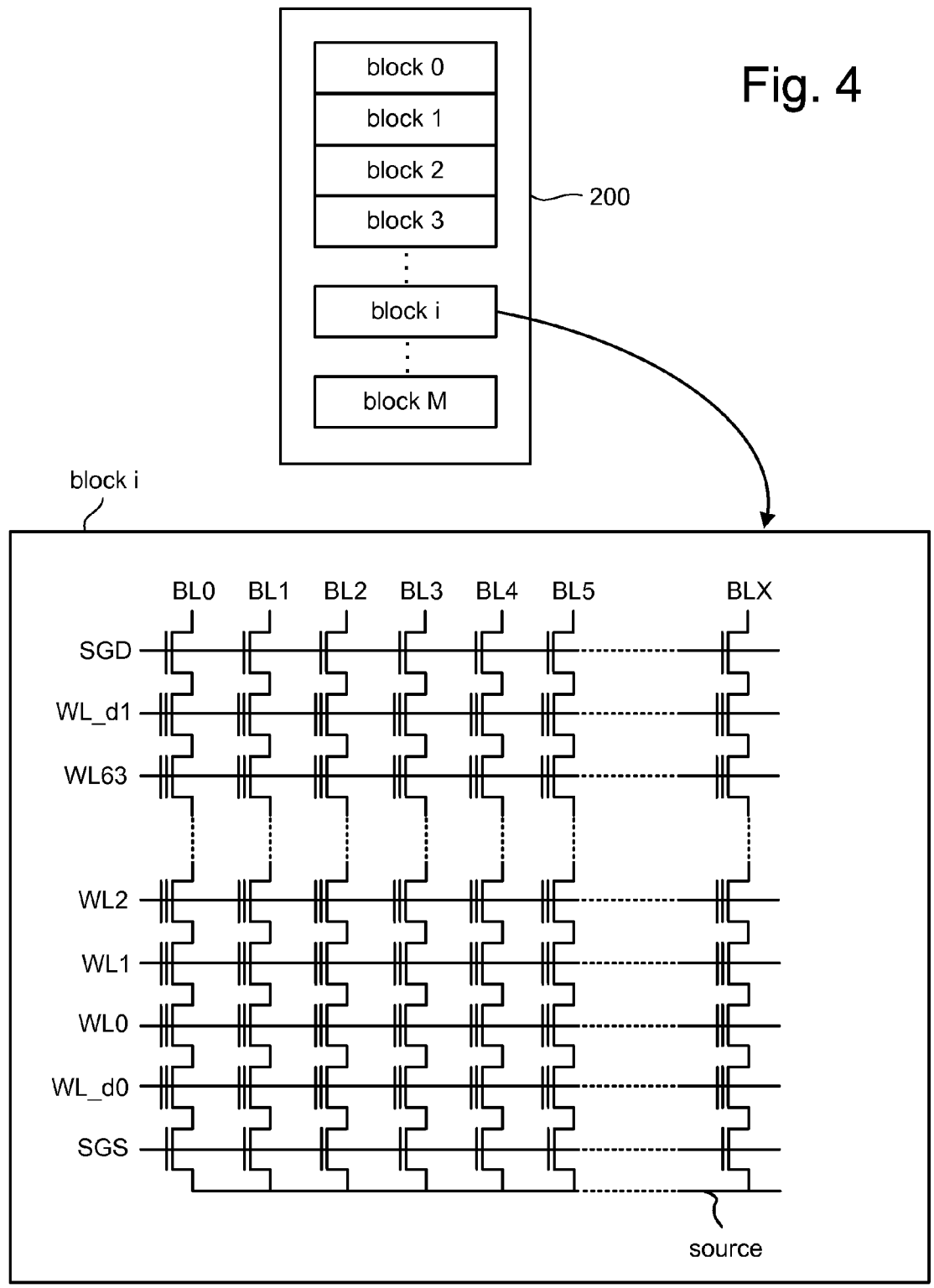
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data may be 512 bytes, as one example, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 5:
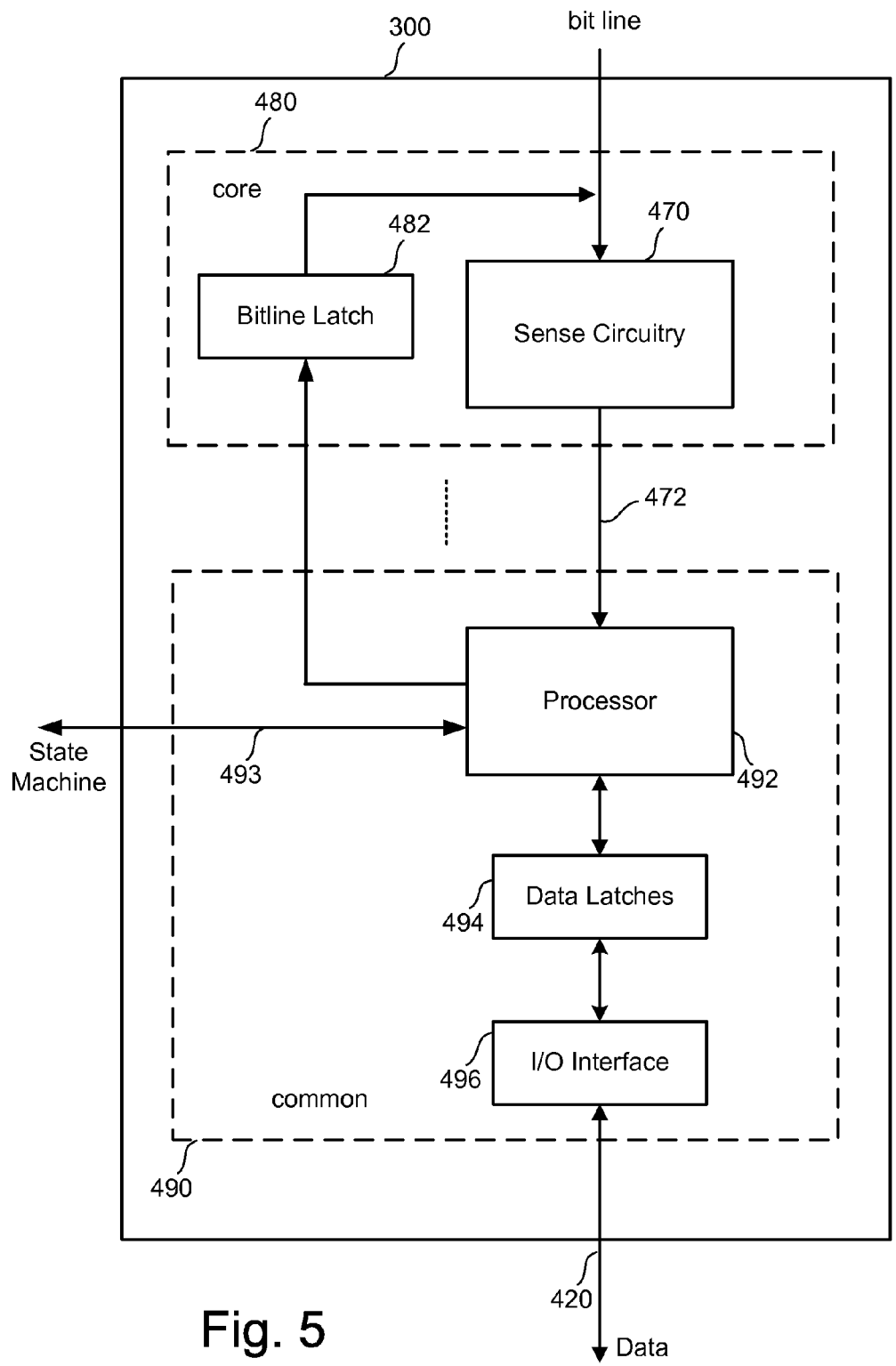
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example threshold voltage distributions corresponding to data states for the memory cell array when each memory cell stores four bits of data. Other embodiment, however, may use more or less than four bits of data per memory cell. FIG. 6A shows 16 threshold voltage distributions corresponding to data states 0-15. In one embodiment, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6A shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6A shows Vv1 for state 1 and Vv2 for state 2. When programming memory cells to a given state, the system will test whether those memory cells have a threshold voltage greater than or equal to the verify reference voltage.

FIG. 6B illustrates that another embodiment of threshold voltage distributions corresponding to data states 0-15 can partially overlap since the correction algorithm can handle a certain percentage of cells that are in error.

Also note that the threshold voltage axis may be offset from actual voltages applied to the control gates as body effect through source or body biasing is used to shift negative threshold voltage into the measurable positive range. Another point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

In the example implementations of FIGS. 6A and 6B, the non-volatile storage elements store four bits of data per storage element, using four data states. As an example, the coding may be as in Table I.

TABLE I

| Page | Erase | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Upper | 0 | 0 | 0 | 0 | 0 | 1 | 1 | 1 | 0 | 0 | 1 | 1 | 1 | 1 | 1 | 0 |
| HM | 1 | 1 | 0 | 0 | 1 | 1 | 0 | 0 | 0 | 0 | 0 | 0 | 1 | 1 | 1 | 1 |
| LM | 0 | 1 | 1 | 1 | 1 | 1 | 1 | 0 | 0 | 0 | 0 | 1 | 1 | 0 | 0 | 0 |
| Lower | 1 | 1 | 1 | 0 | 0 | 0 | 0 | 0 | 0 | 1 | 1 | 1 | 1 | 1 | 0 | 0 |

In the coding scheme of Table I, the Erase state stores data 0101, State 1 stores data 0111, State 2 stores data 0011, etc. The example in Table I is Gray coding because only one bit changes between any two adjacent states. For example, between the Erase state and A state the only bit that is different is the third bit. It is not an absolute requirement that Gray coding be used. In one embodiment, a group of memory cells stores four pages of data. For reference purposes, these pages of data will be called upper page, high-middle, low-middle, and lower page; however, they can be given other labels.

An alternative coding scheme when storing four bits per memory cells is provided in Table II.

TABLE II

| Page | Erase | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Upper | 0 | 0 | 0 | 1 | 1 | 1 | 0 | 0 | 1 | 1 | 1 | 1 | 1 | 0 | 0 | 0 |
| HM | 0 | 0 | 1 | 1 | 0 | 0 | 0 | 0 | 0 | 0 | 1 | 1 | 1 | 1 | 1 | 1 |
| LM | 1 | 1 | 1 | 1 | 1 | 0 | 0 | 0 | 0 | 1 | 1 | 0 | 0 | 0 | 0 | 1 |
| Lower | 1 | 0 | 0 | 0 | 0 | 0 | 0 | 1 | 1 | 1 | 1 | 1 | 0 | 0 | 1 | 1 |

In the coding scheme of Table II, the Erase state stores data 0011, State 1 stores data 0010, State 2 stores data 0110, etc. The example in Table II is Gray coding because only one bit changes between any two adjacent states.

Figure 7:
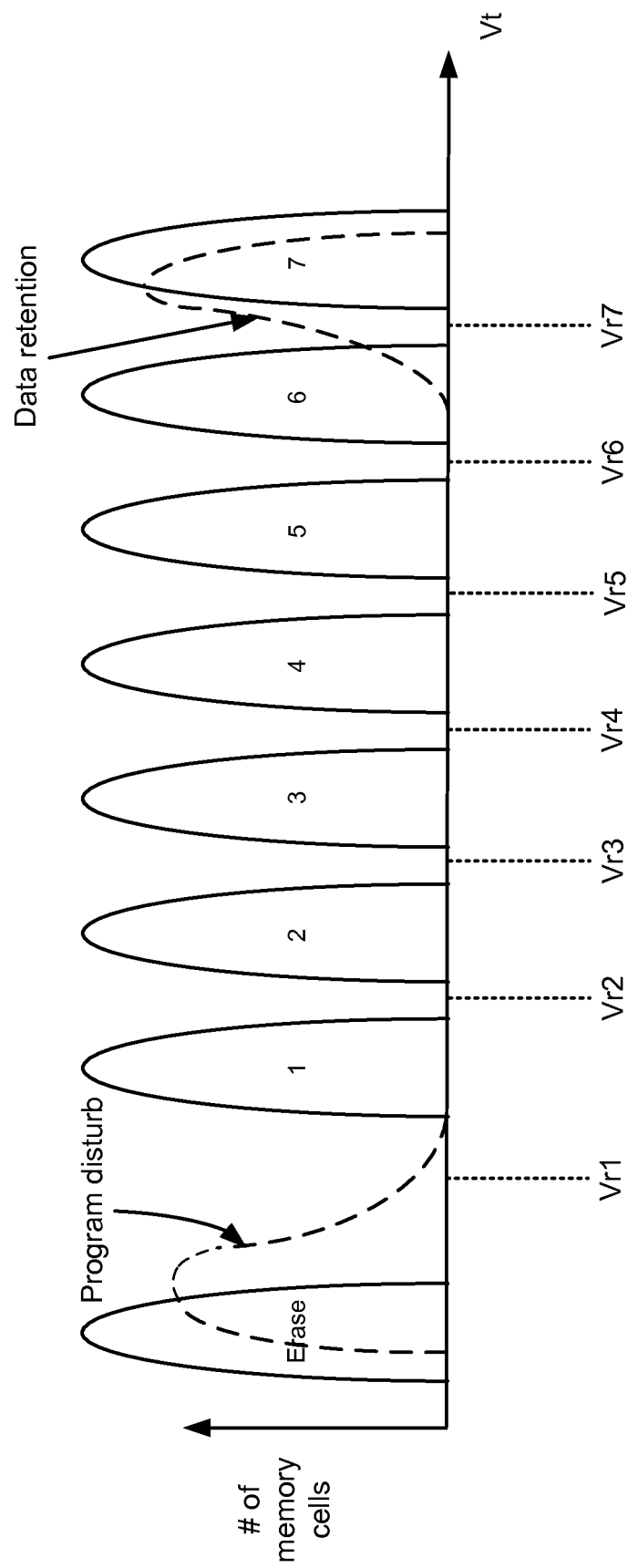
FIG. 7 shows an example threshold distribution that has eight states, which include an erase state and seven programmed states (1-7).

In some embodiments, three bits of data are stored per memory cell. FIG. 7 shows an example threshold distribution that has eight states, which include an erase state and seven programmed states (1-7). Between each threshold voltage distribution is a read voltage, which is used to determine the state of a memory cell. For example, if a memory cell has a threshold voltage that is above Vr1 but below Vr2, then it is assumed to be programmed to state 1.

Table III shows an example coding scheme when storing three bits per memory cell.

TABLE III

| Page | Erase | 1 | 2 | 3 | 4 | 5 | 6 | 7 | Reads/page |
|---|---|---|---|---|---|---|---|---|---|
| Upper | 1 | 0 | 0 | 1 | 1 | 1 | 0 | 0 | 1, 3, 6 |
| Middle | 1 | 1 | 0 | 0 | 0 | 1 | 1 | 0 | 2, 5, 7 |
| Lower | 1 | 1 | 1 | 1 | 0 | 0 | 0 | 0 | 4 |

In the coding scheme of Table III, the Erase state stores data 111, State 1 stores data 011, State 2 stores data 001, etc. The example in Table III is Gray coding because only one bit changes between any two adjacent states. The reads/page column indicates which reads should be done in order to read each page. For example, referring to FIG. 7, the lower page can be read by reading at Vr4. The middle page can be read by reading at Vr2, Vr5 and Vr7. The upper page can be read by reading at Vr1, Vr3 and Vr6. In one embodiment, the sequence of reading the pages is lower, middle, upper. It is not required that the entire sequence is used. For example, reading could stop after reading the lower page.

One aspect to note about the coding scheme of Table III is that the greatest number of reads per page is three. Note that in some conventional read schemes the greatest number of reads per page is four (for the case of three bits/memory cell). Keeping the maximum number of reads that are needed for any page can help to improve system performance.

Table IV shows another example coding scheme when storing three bits per memory cell.

TABLE IV

| Page | Erase | 1 | 2 | 3 | 4 | 5 | 6 | 7 | Reads/page |
|---|---|---|---|---|---|---|---|---|---|
| Upper | 1 | 1 | 0 | 0 | 0 | 1 | 1 | 0 | 2, 5, 7 |
| Middle | 1 | 0 | 0 | 1 | 1 | 1 | 0 | 0 | 1, 3, 6 |
| Lower | 1 | 1 | 1 | 1 | 0 | 0 | 0 | 0 | 4 |

In the coding scheme of Table IV, the Erase state stores data 111, State 1 stores data 101, State 2 stores data 001, etc. The example in Table IV is Gray coding because only one bit changes between any two adjacent states. Referring to FIG. 7, the lower page can be read by reading at Vr4. The middle page can be read by reading at Vr1, Vr3 and Vr6. The upper page can be read by reading at Vr2, Vr5 and Vr7. One aspect to note about the coding scheme of Table IV is that the greatest number of reads per page is three. In one embodiment, the sequence of reading the pages is lower, middle, upper. It is not required that the entire sequence is used. For example, reading could stop after reading the lower page.

Table V shows another example coding scheme when storing three bits per memory cell.

TABLE V

| Page | Erase | 1 | 2 | 3 | 4 | 5 | 6 | 7 | Reads/page |
|---|---|---|---|---|---|---|---|---|---|
| Upper | 1 | 1 | 0 | 0 | 1 | 1 | 0 | 0 | 2, 4, 6 |
| Middle | 1 | 0 | 0 | 0 | 0 | 1 | 1 | 1 | 1, 5 |
| Lower | 1 | 1 | 1 | 0 | 0 | 0 | 0 | 1 | 3, 7 |

In the coding scheme of Table V, the Erase state stores data 111, State 1 stores data 101, State 2 stores data 001, etc. The example in Table V is Gray coding because only one bit changes between any two adjacent states. Referring to FIG. 7, the lower page can be read by reading at Vr3 and Vr7. The middle page can be read by reading at Vr1 and Vr5. The upper page can be read by reading at Vr2, Vr4 and Vr6. One aspect to note about the coding scheme of Table V is that the greatest number of reads per page is three. In one embodiment, the sequence of reading the pages is lower, middle, upper. It is not required that the entire sequence is used. For example, reading could stop after reading the lower page.

TABLE VI

| Page | Erase | 1 | 2 | 3 | 4 | 5 | 6 | 7 | Reads/page |
|---|---|---|---|---|---|---|---|---|---|
| Upper | 1 | 0 | 0 | 1 | 0 | 0 | 1 | 1 | 1, 3, 4, 6 |
| Middle | 1 | 1 | 0 | 0 | 1 | 0 | 0 | 1 | 2, 4, 5, 7 |
| Lower | 1 | 1 | 1 | 1 | 0 | 0 | 0 | 0 | 4 |

In the coding scheme of Table VI, the Erase state stores data 111, State 1 stores data 011, State 2 stores data 001, etc. Referring to FIG. 7, the lower page can be read by reading at Vr4. The middle page can be read by reading at Vr2, Vr4, Vr5 and Vr7. The upper page can be read by reading at Vr1, Vr3, Vr4, and Vr6. In one embodiment, the sequence of reading the pages is lower, middle, upper. It is not required that the entire sequence is used. For example, reading could stop after reading the lower page.

TABLE VII

| Page | Erase | 1 | 2 | 3 | 4 | 5 | 6 | 7 | Reads/page |
|---|---|---|---|---|---|---|---|---|---|
| Upper | 1 | 1 | 1 | 0 | 0 | 0 | 0 | 1 | 3, 7 |
| Middle | 1 | 1 | 0 | 0 | 1 | 1 | 0 | 0 | 2, 4, 6 |
| Lower | 1 | 0 | 0 | 0 | 0 | 1 | 1 | 1 | 1, 5 |

In the coding scheme of Table VII, the Erase state stores data 111, State 1 stores data 110, State 2 stores data 100, etc. The example in Table VII is Gray coding because only one bit changes between any two adjacent states. Referring to FIG. 7, the lower page can be read by reading at Vr1 and Vr5. The middle page can be read by reading at Vr2, Vr4, and Vr6. The upper page can be read by reading at Vr3 and Vr7. One aspect to note about the coding scheme of Table VII is that the greatest number of reads per page is three. In one embodiment, the sequence of reading the pages is lower, middle, upper. It is not required that the entire sequence is used. For example, reading could stop after reading the lower page. In one embodiment, reading is performed sequentially over the read compare points (e.g., Vr1, Vr2, Vr3 . . . Vr7). Therefore, after Vr5 has been read, the data for the lower page may be determined and provided to the user. After Vr6 has been read, the data for the middle page may be determined and provided to the user. After Vr7 has been read, the data for the upper page may be determined and provided to the user.

Referring again to FIG. 7, which shows an example threshold distribution that has eight states, the effects of program disturb are shown on the erase state and the effects of data retention are shown in the highest state (state 7). Specifically, the effects of program disturb are depicted on the threshold voltage distribution of the erase state. Program disturb causes the erase state distribution to shift upward as depicted by the dashed line labeled "program disturb." Program disturb also affects other states, but the shifts to other threshold voltage distributions have not been depicted in FIG. 7. Note that those memory cells with threshold voltage that have been shifted above Vr1 (but are still below Vr2) will be read as being in state 1. However, error correction can be used to correct for these shifts, providing that there are not too many memory cells that have their threshold voltages shifted to another state.

The effects of the data retention problem is depicted on state 7. The data retention problem causes the threshold voltage distribution of state 7 to shift downward as depicted by the dashed line labeled "data retention." Data retention also affects other states, but shifts to other threshold voltage distributions have not been depicted in FIG. 7. Note that those memory cells with threshold voltages that have been shifted below Vr7 (but are still above Vr6) will be read as being in state 6. However, error correction can be used to correct for these shifts, providing that there are not too many memory cells that have their threshold voltages shifted to another state.

For some memory devices, data retention problems are more severe for memory cells in the highest programmed state. On the other hand, program disturb may have a greater impact on memory cells that are programmed to lower states. For example, memory cells that are in the erased state (after programming) may be impacted by program disturb to a greater extent than memory cells in states 1-7.

Thus, there may be more errors when attempting to distinguish the erase state from state 1 than for other states. In other words, reading at Vr1 can be more problematic that other read compare points (Vr2 . . . Vr7). Likewise, there may be more errors when attempting to distinguish the state 6 from state 7 than for other states. In other words, reading at Vr7 can be more problematic that other read compare points (Vr1 . . . Vr6). Higher error rates place a greater burden on the ECC algorithm.

Therefore, reads may be performed at seven read points (e.g., Vr1, Vr2, . . . Vr7). However, reading at two of the points may be more problematic than reading at the other read points. The coding is such that at most one of the problematic read compare points is needed to read a given page, in some embodiments. The following examples will be used to illustrate for a case in which reading at Vr1 and Vr7 may present more problems than reading at other read compare points.

In the scheme depicted in Table III, reading the upper page involves reading at Vr1 (but not Vr7), whereas reading the middle page involves reading at Vr7 (but not Vr1). Therefore, the ECC bits used to correct the reading of the upper page do not have to correct for errors due to reading at Vr7. Likewise, the ECC bits used to correct the reading of the middle page do not have to correct for errors due to reading at Vr1.

In the scheme depicted in Table IV, reading the upper page involves reading at Vr7 (but not Vr1), whereas reading the middle page involves reading at Vr1 (but not Vr7). Therefore, the ECC bits used to correct the reading of the upper page do not have to correct for errors due to reading at Vr1. Likewise, the ECC bits used to correct the reading of the middle page do not have to correct for errors due to reading at Vr7.

In the scheme depicted in Table V, reading the middle page involves reading at Vr1 (but not Vr7), whereas reading the lower page involves reading at Vr7 (but not Vr1). Therefore, the ECC bits used to correct the reading of the middle page do not have to correct for errors due to reading at Vr7. Likewise, the ECC bits used to correct the reading of the lower page do not have to correct for errors due to reading at Vr1.

In the scheme depicted in Table VI, reading the upper page involves reading at Vr1 (but not Vr7), whereas reading the middle page involves reading at Vr7 (but not Vr1). Therefore, the ECC bits used to correct the reading of the upper page do not have to correct for errors due to reading at Vr7. Likewise, the ECC bits used to correct the reading of the middle page do not have to correct for errors due to reading at Vr1.

In the scheme depicted in Table VII, reading the upper page involves reading at Vr7 (but not Vr1), whereas reading the lower page involves reading at Vr1 (but not Vr7). Therefore, the ECC bits used to correct the reading of the upper page do not have to correct for errors due to reading at Vr1. Likewise, the ECC bits used to correct the reading of the lower page do not have to correct for errors due to reading at Vr7.

Note that in the foregoing examples, reading at Vr1 and Vr7 was used as one example. Other read compare points might be separated to different pages. For example, there might be a significant problem reading at Vr5 and a significant problem reading at Vr3. In the scheme depicted in Table III, the upper page involves reading at Vr3 (but not Vr5), whereas the middle page involves reading at Vr5 (but not Vr3). Therefore, the ECC bits used to correct the reading of the upper page do not have to correct for errors due to reading at Vr5. Likewise, the ECC bits used to correct the reading of the middle page do not have to correct for errors due to reading at Vr3.

Referring again to the example coding scheme of Table III note the following. The erase state and state 1 are distinguished by the upper page. That is, their bits are the same for the lower and middle page, but are different for the upper page. On the other hand, states 6 and 7 are distinguished based on the middle page. That is, states 6 and 7 have the same bits for the lower page and the upper page, but have different bits for the middle page. Each page may have its own ECC bits. Moreover, the controller applies an ECC algorithm to each page separately. Therefore, the error correction process of distinguishing between the erase state and state 1 is decoupled from the error correction process of distinguishing between the state 6 and state 7.

In some embodiments, program disturb is a significant problem for states with lower threshold voltages and data retention is significant problem for states with higher threshold voltages. Thus, it may be stated that the process of correcting errors for states that are most likely to be impacted by program disturb is decoupled from the process of correcting errors for states that are most likely to be impacted by data retention.

Note that there is no reason why the process needs to focus on the two lowest states and the two highest states. For example, if distinguishing between states 2 and 3 is likely to have a high error rate and distinguishing between states 4 and 5 is likely to have a high error rate, then coding might be established in a manner that distinguishes between states 2 and 3 on the middle page and between 4 and 5 on the upper page.

Also note that while the foregoing example in effect divides the ECC burden between the upper page and middle page, the ECC burden might also be shifted to the ECC correction process of reading a lower page. For example, referring to the example in Table V, the erase state is distinguished from state 1 based on the middle page. That is, the middle page has its own ECC bits and the controller applies an ECC algorithm to user data bits for the middle page and the ECC bits for the middle page to correct the middle page when reading the middle page. On the other hand, states 6 and 7 are distinguished based on the lower page. That is, the lower page has its own ECC bits and the controller applies an ECC algorithm to user data bits for the lower page and the ECC bits for the lower page to correct the lower page when reading the lower page.

Figure 8:
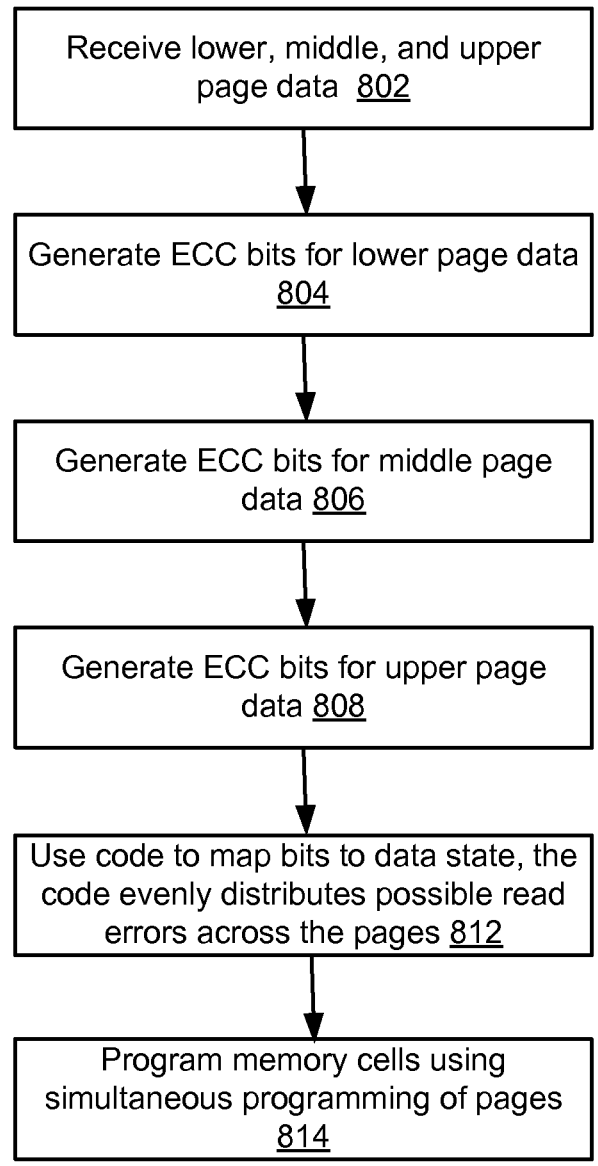
FIG. 8 is one embodiment of a process for programming memory cells.

FIG. 8 is one embodiment of a process for programming memory cells to multi-bits using a code that spreads errors across different the bits. The process will use an example in which three pages of data are to be stored in the memory cells. Note that more or fewer pages could be stored. In step 802, the controller 244 accesses a plurality of pages of data (e.g., "n" pages of data) to be programmed into a group of non-volatile storage elements. For example, the controller 244 receives a lower page, a middle page, and an upper page of data (e.g., user data).

In step 804, the controller 244 generates ECC bits for the lower page of data. As an example, the lower page might contain 8K bits of user data. The controller 244 applies an ECC algorithm to the 8K of user data to generate additional ECC bits. In step 806, the controller 244 generates ECC bits for the middle page of data. In step 808, the controller generates ECC bits for the upper page of data. Steps 806 and 808 are similar to steps 804. In one embodiment, the controller uses BCH (Bose-Chaudun-Hocquenghem) codes. However, other codes may be used.

In step 812, the controller 244 maps the pages based on a coding scheme that evenly distributes read errors across the plurality of pages of data. In one embodiment, the controller 244 maps the pages based on a coding scheme that distributes a first type of read error to a first of the pages and a second type of read error to a second of the pages. For example, read errors that might be due to data retention problems are distributed to a first page, whereas read errors that might be due to program disturb problems are distributed to a second page.

In one embodiment, the controller 244 maps the pages to a data state for each of the non-volatile storage elements based on a coding scheme in which first and second read compare points that are associated with higher error rates than the other read compare points are distributed to different pages. For example, a first page is associated with a first set of read compare points and a second page is associated with a second set of read compare points. Tables III-VII provide several examples that list read compare points for different pages. The coding may be such that a first read compare point is in the first set but not in the second set, and a second read compare point is in the second set but not in the first set. For example, referring to Table III, read compare point Vr1 is used for the upper page, but not the middle page. Likewise, read compare point Vr7 is used for the middle page, but not the upper page. The first and second read compare points may be associated with higher error rates than the other read compare points. For example, read compare points Vr1 and Vr7 may be associated with higher error rates than other read compare points (e.g., Vr2 . . . Vr6).

As a part of step 812, the controller 244 may determine what state each memory cell should be programmed to in order to store the user data. For example, the controller 244 uses one of the coding schemes described herein. As a particular example, if the coding scheme from Table III is being used, and if the upper page data is "1", the middle page data is "1" and the lower page data is "0", then the controller 244 determines that the memory cell should be programmed to state 5.

In step 814, the memory cells are programmed to the physical states that were determined in step 812. In some embodiments, the plurality of pages are programmed into the memory cells simultaneously. This is in contrast to some techniques that sequentially program the pages. For example, in a sequential page programming technique, first the threshold voltages of memory cells is modified to program the lower page. Then, after successfully programming the upper page, the threshold voltages of memory cells are modified to program the middle page. Then, after successfully programming the middle page, the threshold voltages of memory cells are modified to program the upper page. Pages, could be programmed in a different order; however, some sequence is used in a sequential page programming technique. Note that typically the threshold voltage of a memory cell is not decreased during programming (for example, it is either increased of kept the same). Therefore, the coding scheme may be limited in a sequential page programming technique. In some embodiments of the process of FIG. 8, the coding scheme that is used is one that is not possible if a sequential page programming technique were to be used.

In one embodiment, the memory cells are programmed in a foggy/fine programming sequence. Programming using a foggy/fine sequence is one way of programming the pages simultaneously and allows for great flexibility in assigning codes to the memory states. Any of the example coding schemes discussed herein may be used when programming with a foggy/fine programming sequence. However, note that the coding schemes discussed herein are not limited to foggy/fine programming.

In one embodiment, the foggy/fine programming includes a first "foggy" programming stage and a second "fine" programming stage. FIG. 9B depicts one embodiment of Vt distributions after a foggy program stage. In this example, there is an erase state and seven foggy programmed states 1F-7F. At or near the lower edge of each foggy programmed state 1F-7F are verify reference voltages. For example, FIG. 9B shows verify voltage "Vvf1" for state "1F," verify voltage "Vvf2" for state "2F," etc. The intent of the foggy programming stage is to move the threshold voltages partway from the erased threshold distribution to the final target range.

FIG. 9C depicts one embodiment of Vt distributions after a fine program stage. After the fine programming stage, the threshold voltages of the memory cells are within the final target range for each state. In this example, there is an erase state and seven final programmed states 1-7. At or near the lower edge of each final programmed state 1-7 are verify reference voltages. For example, FIG. 9C shows verify voltage "Vv1" for state "1," verify voltage "Vv2" for state "2," etc. FIG. 9C also depicts read reference voltages between the programmed states. For example, read reference voltage Vr1 is between the erased state and state 1, read reference voltage Vr2 is between state 1 and state 2, etc. By testing whether the threshold voltage of a given memory cell is above or below the respective read reference voltages, the system can determine what state the memory cell is in. Referring back to FIG. 9B note that read reference voltages are not needed for the foggy programmed states because these are intermediate programmed states.

Figure 10A:
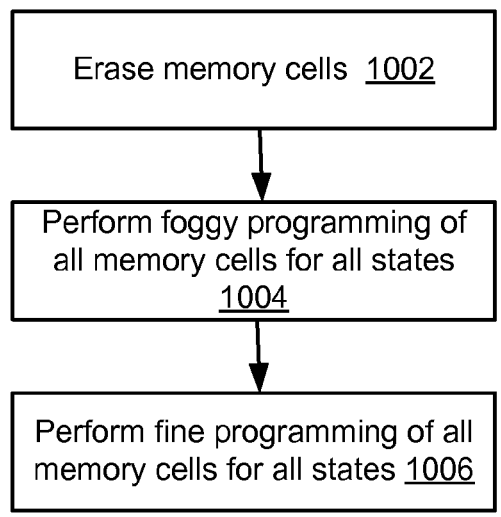
FIG. 10A depicts one embodiment of a process of foggy/fine programming of memory cells.

FIG. 10A depicts one embodiment of a process 1000 of foggy/fine programming of memory cells. Process 1000 is one implementation of step 814 of FIG. 8. FIGS. 9A-9C will be referred to when discussing process 1000. Note that although FIGS. 9A-9C depicts an example in which there are eight states, process 1000 is applicable to having more or fewer data states. In step 1002, the memory cells are erased. Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. FIG. 9A depicts one embodiment of a Vt distribution after memory cells are erased.

In step 1004, a foggy programming of the memory cells is performed for each state. In some embodiments, step 1004 includes sub-steps of foggy programming all of the memory cells that are to be programmed to a given state together. For example, memory cells that are to have state 1 as their final state are programmed to the 1F state. Then, memory cells that are to have state 2 as their final state are programmed to the 2F state. Next, memory cells that are to have state 3 as their final state are programmed to the 3F state and so forth until all memory cells have been programmed to the appropriate foggy programmed state. FIG. 9B depicts one embodiment of threshold voltage distributions after a foggy program stage. Note that memory cells could be foggy programmed in a different order. Thus, it is not required that the programming order be from the 1F state to the 7F state.

In step 1006, fine programming of the memory cells is performed for each state. In some embodiments, step 1006 includes sub-steps of fine programming all of the memory cells that are to be programmed to a given state together. For example, memory cells that are to have state 1 as their final state are programmed from the state 1F to state 1. Then, memory cells that are to have state 2 as their final state are programmed from the 2F state to the 2 state. Next, memory cells that are to have state 3 as their final state are programmed from the 3F state to the 3 state and so forth until all memory cells have been programmed to the appropriate final programmed state. FIG. 9C depicts one embodiment of Vt distributions after a fine programming stage. Note that memory cells could be final programmed in a different order. Thus, it is not required that the programming order be from the 1 state to the 7 state.

Figure 11:
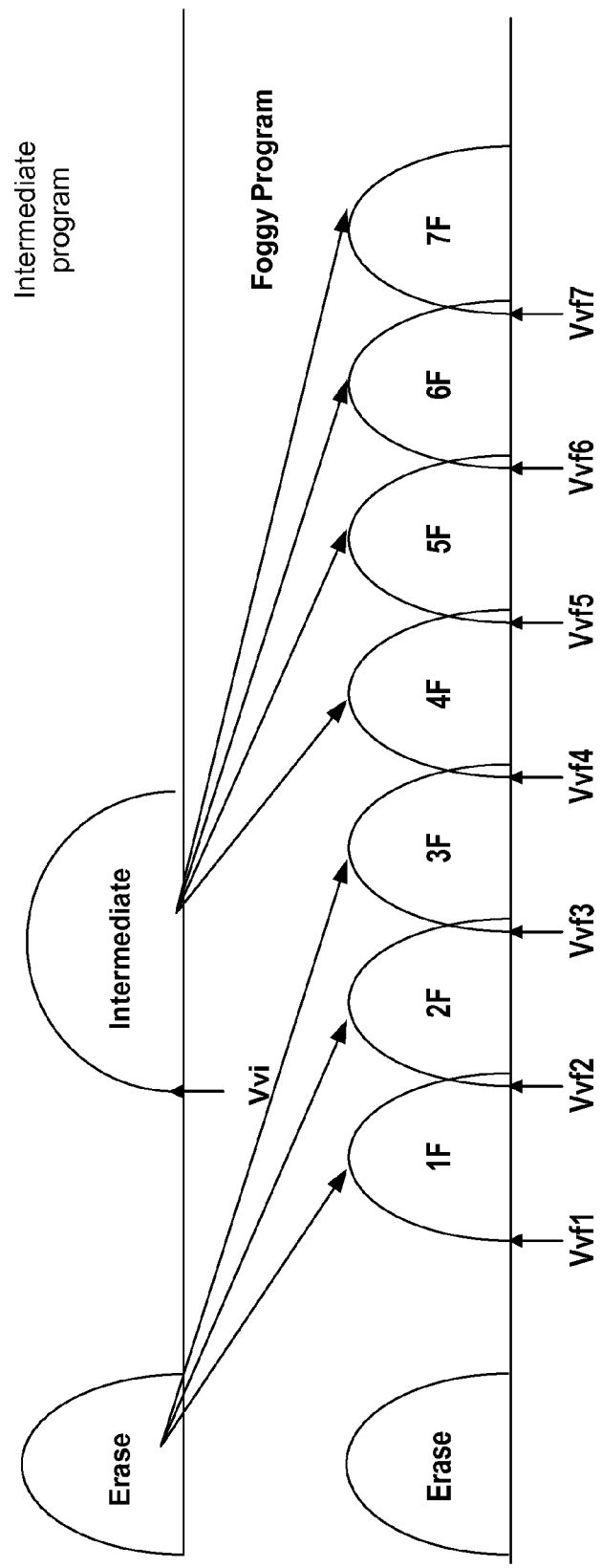
FIG. 11 depicts one embodiment of Vt distributions after an intermediate program stage, as well as after a later foggy programming stage.

In one embodiment, the foggy/fine programming includes an intermediate program stage prior to the "foggy" programming stage. In one embodiment in which there are eight states, the intermediate program stage programs memory cells whose final state is to be any of states 4-7 to an intermediate level. FIG. 11 depicts one embodiment of Vt distributions after an intermediate program stage, as well as after a later foggy programming stage. At or near the lower edge of the intermediate state is a verify reference voltage "Vvi." In the foggy program stage, memory cells that are to whose final state is to be any of 4-7 are foggy programmed from the intermediate level to one of the states 4F-7F, as indicated by the arrows. Memory cells that are to whose final state is to be any of 1-3 are foggy programmed from the erase state to one of the states 1F, 2F, or 3F, as indicated by the arrows.

Figure 10B:
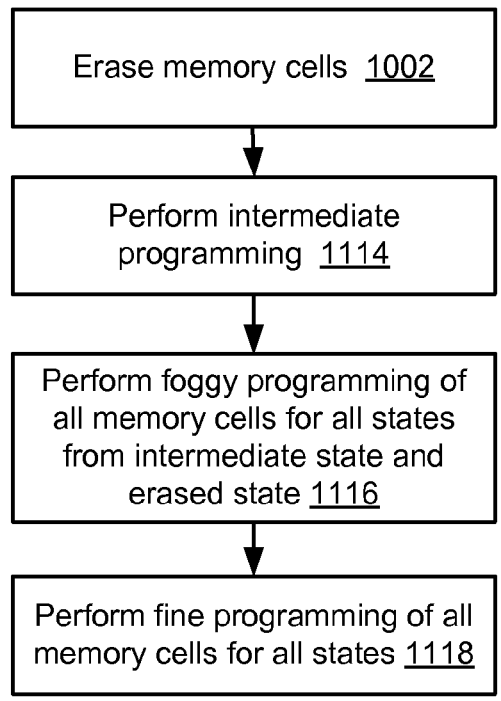
FIG. 10B depicts one embodiment of a process of foggy/fine programming of memory cells in which an intermediate programming is performed prior to the foggy programming.

FIG. 10B depicts one embodiment of a process 1010 of foggy/fine programming of memory cells in which an intermediate programming is performed prior to the foggy programming. Process 1010 is one implementation of step 814 of FIG. 8. FIG. 11 will be referred to when discussing process 1010. Note that although FIG. 11 depicts an example in which there are eight states, process 1010 is applicable to having more or fewer data states. In step 1002, the memory cells are erased.

In step 1114, an intermediate programming of selected memory cells is performed. In one embodiment, the intermediate programming is applied to memory cells whose final state is to be one of the highest one-half of the states. For example, if there are a total of eight states, than memory cells that are to be programmed to one of states 4-7 receives the intermediate programming. If there are a total of sixteen states, then those memory cells that are to end up in one of the highest eight states receive the intermediate programming. The result after step 1114 is that some memory cells are still in the erased state and other have their threshold voltage at an intermediate level, as depicted in FIG. 11.

In step 1116, foggy programming is performed. In step 1116, memory cells whose final program state is to be any of 1-3 are foggy programmed from the erased state to states 1F, 2F, 3F, in accordance with their final states. Likewise, memory cells whose final program state is to be any of 4-7 are foggy programmed from the intermediate level state to states 4F, 5F, 6F, and 7F in accordance with their final states. Typically, step 1116 contains a number of sub-steps in which memory cells with like final states are programmed together. The foggy programming of memory cells from either the erased state or the intermediate level state is depicted in FIG. 11 by the arrows.

In step 1118, fine programming of the memory cells is performed for each state. This step is similar to step 1006 of FIG. 10A. For example, memory cells that are to have state 1 as their final state are programmed from the 1F state to the 1 state. FIG. 9C depicts one embodiment of Vt distributions after a fine programming stage.

Figure 12:
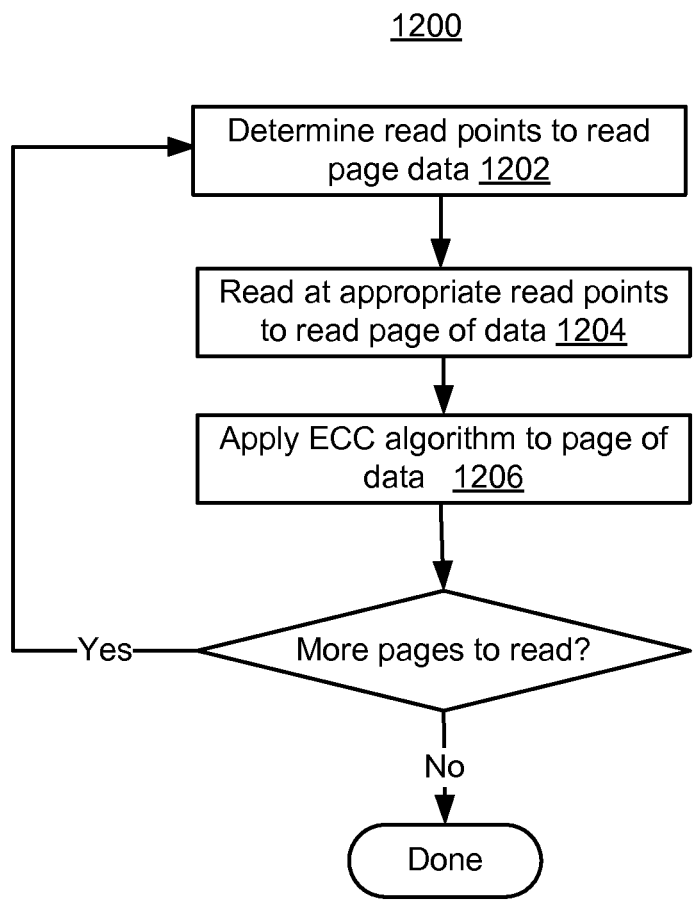
FIG. 12 depicts one embodiment of reading memory cells.

FIG. 12 depicts one embodiment of a process 1200 of reading memory cells. Reading memory cells may be performed after process 800 has been used to store data in the memory cells. Thus, after programming the memory cells using a coding scheme that stores data into different physical states (e.g., different threshold voltage ranges) in process 800, the memory cells are read using the same coding scheme. As previously discussed, the coding scheme may serve to distribute read errors across different pages. Another way of stating this is that the coding scheme may serve to distribute read errors across different bits in each of the memory cells. For example, errors that may occur when the read point is Vr1 are handled when reading a first bit that is stored in the memory cells, whereas errors that may occur when the read point is Vr7 are handled when reading a second bit that is stored in the memory cells.

Each memory cells store "n" bits of data. For purposes of illustration, a group of the non-volatile storage elements will be discussed as storing "n" pages of data. In this example, each non-volatile storage element stores one bit from each of the "n" pages. Thus, each of the non-volatile storage elements stores data in one of $2^n$ data states. Each of the $2^n$ data states corresponds to a separate threshold voltage range. For example, referring to FIG. 9C, non-volatile storage element was programmed to one of eight different data states.

In step 1202, read points that are appropriate to read the present page to be read are determined. Determining the read points may include mapping the page to one or more of $2^n$ data states based on a coding scheme that evenly distributes errors that may occur when reading the non-volatile storage elements across the "n" pages of data. For example, referring to the coding scheme of Table III as an example, if the lower page is to be read, then the memory cells are read to determine whether their threshold voltage is above or below Vr4. In other words, the read point is established as Vr4. On the other hand if, the middle page is to be read, then read points are established at Vr2, Vr5 and Vr7. If the upper page is to be read, then read points are established at Vr1, Vr3 and Vr6.

In step 1204, memory cells are read at appropriate read points determined in step 1202. Referring to the coding scheme of Table III as an example, the memory cells are read to determine whether their threshold voltage is above or below Vr4. In other words, a determination is made whether each memory cell is in the group including the erased state and states 1-3 or in the group including states 4-7. Note that in Table III, group including the erased state and states 1-3 are assigned the value "1" and the group including states 4-7 are assigned the value "0." However, the values "1" and "0" could be reversed.

In step 1206, an ECC algorithm is applied to the data read in step 1204. The data that was read in will include a certain number of user data bits and some ECC bits. The ECC bits may have been generated by the controller applying an algorithm to the user data for the page at the time the user data was stored. Thus, when the user data for the page is stored, a certain number of ECC bits are stored with it. Note that each page of data may have its own set of ECC bits. In step 1206, the controller applies an ECC algorithm to the user data bits and the ECC bits for the page to correct any errors in the page of data just read in. For example, when the user data for the lower page is stored, a certain number of ECC bits are stored with it. The controller may apply an ECC algorithm to the user data bits and the ECC bits for the lower page to correct any errors in the lower page of data just read in.

If there are more pages to read, then process 1200 continues at step 1202. Otherwise, the process ends. For example, next the middle page can be read, then the upper page can be read. Note that it is not required that all pages are read. Also, it is not required that pages are read in any particular order. For example, for memory cells that store three bits per cell, the upper page could be read prior to reading the lower page.

Figure 13:
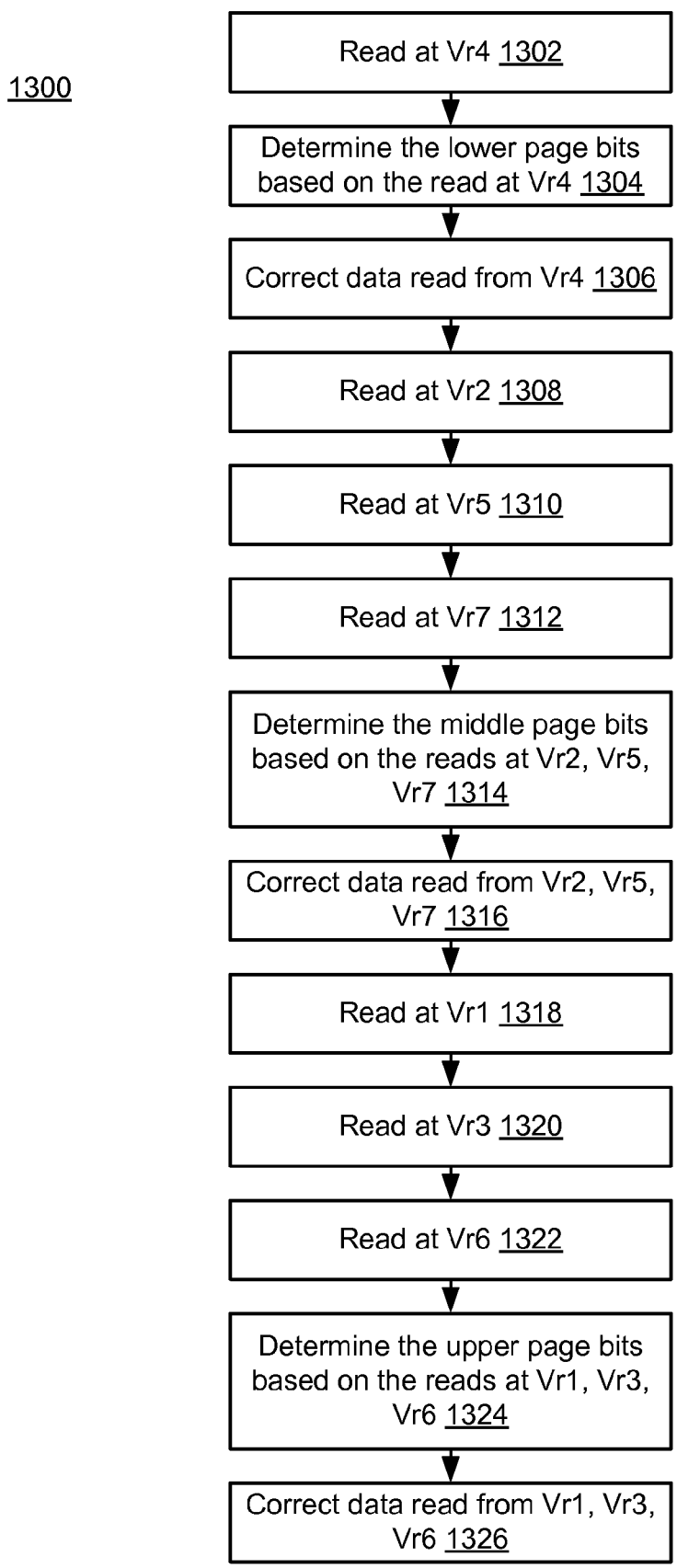
FIG. 13 is a flowchart of one embodiment of a process of reading memory cells.

FIG. 13 is a flowchart of one embodiment of a process 1300 of reading memory cells that were programmed using the example coding scheme of Table III. Process 1300 provides further details for process 1200. In step 1302, memory cells are read at Vr4. Reading at Vr4 determines whether a memory cell has a threshold voltage above or below Vr4.

In step 1304, the controller determines the lower page bits based on the reads of each memory cell at Vr4. Referring to Table III if the memory cell is in the erase state or in any of states 1-3, then the lower page bit is "1." On the other hand, if the memory cell is in any of states 4-7, then the lower page bit is "0." Therefore, reading at Vr4 uniquely determines the data for the lower page.

In step 1306, the controller corrects the data read in during step 1304. For example, the data just read in contains the user data for the lower page, as well as the ECC bits for the lower page. The controller applies an ECC algorithm to correct any errors in the just read in data.

In step 1308, memory cells are read at Vr2. In one embodiment, the result of the read of each memory cell is stored in a latch that is connected the bitline for the memory cell. In step 1310, memory cells are read at Vr5. In step 1312, memory cells are read at Vr7. Note that the order of steps 1308-1312 may be performed in any order. For example, the order of reads might be Vr5, Vr2, Vr7.

In step 1314, the controller determines the middle page bits based on the reads of each memory cell at Vr2. Vr5, and Vr7. Referring to Table III if the memory cell is in the erase state, state 2, state 5, or state 6, then the middle page data is "1". Note that if a memory cell is in one of states 5 or 6, it is not required to determine which of the two states the memory cell is in to be certain that the middle page data is "1". On the other hand, if the memory cell state 2, state 3, state 4 or state 7, then the middle page bit is "0." Note that if a memory cell is in one of states 3 or 4, it is not required to determine which of the two states the memory cell is in to be certain that the middle page data is "0". Therefore, the reads at Vr2. Vr5, and Vr7 provide sufficient information to uniquely determine the middle page bit that is stored in each memory cell.

In step 1316, the controller corrects the data read in during steps 1308-1312. For example, the data just read in contains the user data for the middle page, as well as the ECC bits for the middle page. The controller applies an ECC algorithm to correct any errors in the just read in data for the middle page.

In step 1318, memory cells are read at Vr1. In one embodiment, the result of the read of each memory cell is stored in a latch that is connected the bitline for the memory cell. In step 1320, memory cells are read at Vr3. In step 1322, memory cells are read at Vr6. Note that the order of steps 1318-1322 may be performed in any order.

In step 1324, the controller determines the upper page bit of each memory cell based on the reads of each memory cell at Vr1, Vr3, and Vr6. Referring to Table III if the memory cell is in the erase state, state 3, state 4, or state 5, then the upper page data is "1". Note that if a memory cell is in any of states 3-5, it is not required to determine which of the three states the memory cell is in order to be certain that the upper page data is "1". On the other hand, if the memory cell state 1, state 2, state 6 or state 7, then the upper page bit is "0." Note that if a memory cell is in one of states 1 or 2, it is not required to determine which of the two states the memory cell is in to be certain that the upper page data is "1". Also note that if a memory cell is in one of states 6 or 7, it is not required to determine which of the two states the memory cell is in to be certain that the upper page data is "1". Therefore, the reads at Vr1, Vr3, and Vr6 provide sufficient information to uniquely determine the upper page bit that is stored in each memory cell.

In step 1326, the controller corrects the data read in during steps 1318-1322. For example, the data just read in contains the user data for the upper page, as well as the ECC bits for the upper page. The controller applies an ECC algorithm to correct any errors in the just read in data for the upper page.

Note that in process 1300, that to read any given page reads are performed at most at three read points. For example, to read the middle page data reads are taken at Vr2, Vr5, and Vr7. Also note that to read the upper page of data, reads are performed at three read points: Vr2, Vr5, and Vr7. Thus, the worst case (e.g., highest number of read points) to read any page is three in this example. For example, the number of read in the read sequence is 1-3-3. That is, one read (step 1302) is used for the first page, three reads (steps 1308, 1310, 1312) are used for the second page, and three reads (steps 1318, 1320, 1322) are used for the second page. This minimizes the worst case number of read points to the minimum. Note that other coding schemes, such as those depicted in Tables IV, V and VII also involve a maximum of three reads per page.

Also note that it is not required that all of the pages be read. For example, if only the upper page data is if interest, then steps 1318-1326 could be performed without performing steps 1302-1316. Moreover, note that reading the upper page only requires reads at three read points. Other coding schemes could reduce the number of read points for the upper page even further. Thus, the upper page can be read by itself very efficiently. One reason why reading only the upper page might be of interest is if the user only wanted the data from the upper page. Another reason why only the upper page might be of interest is that a certain type of error might occur mostly on the upper page (or some other page). For example, program disturb errors might occur mostly on the upper page.

Note that program disturb and data retention problems are two examples of significant failure modes that can occur. The coding scheme of some embodiments could distribute other types of errors or failure modes to different pages. In some embodiments, a failure mode that is most likely to occur is distributed to a first page and a failure mode that is second most likely to occur is distributed to a second page.

One embodiment includes a method for operating a non-volatile storage system, comprising accessing "n" pages of data to be programmed into a group of non-volatile storage elements, each of the non-volatile storage elements stores data in one of $2^n$ data states, each of the $2^n$ data states corresponds to a separate threshold voltage range; mapping the "n" pages to a data state for each of the non-volatile storage elements based on a coding scheme that evenly distributes read errors across the "n" pages of data; and programming each of the non-volatile storage elements in the group to a threshold voltage range based on the data states to which the plurality of pages have been mapped, the programming includes programming the "n" pages simultaneously.

One embodiment includes a non-volatile storage system, comprising a memory array including a plurality of non-volatile storage elements and one or more control circuits in communication with the memory array. The one or more control circuits access "n" pages of data to be programmed into a group of non-volatile storage elements, each of the non-volatile storage elements stores data in one of $2^n$ data states, each of the $2^n$ data states corresponds to a separate threshold voltage range. The one or more control circuits map the "n" pages to a data state for each of the non-volatile storage elements based on a coding scheme that evenly distributes read errors across the "n" pages of data. The one or more control circuits program each of the non-volatile storage elements in the group to a threshold voltage range based on the data states to which the "n" pages have been mapped. The programming includes programming the "n" pages simultaneously.

One embodiment includes a method for operating a non-volatile storage system, comprising accessing a plurality of pages of data to be programmed into a group of non-volatile storage elements, each of the non-volatile storage elements stores data in one of $2^n$ data states, each of the $2^n$ data states corresponds to a separate threshold voltage range; mapping the plurality of pages to a data state for each of the non-volatile storage elements based on a coding scheme that distributes program disturb errors to a first of the pages and a data retention errors to a second of the pages; and programming each of the non-volatile storage elements to a threshold voltage range that is appropriate for the data state to which the non-volatile storage elements has been mapped.

One embodiment includes a non-volatile storage system comprising a memory array including a plurality of non-volatile storage elements, and one or more control circuits in communication with the memory array, the one or more control circuits access a plurality of pages of data to be programmed into a group of non-volatile storage elements, each of the non-volatile storage elements stores data in one of $2^n$ data states, each of the $2^n$ data states corresponds to a separate threshold voltage range. The one or more control circuits map the plurality of pages to a data state for each of the non-volatile storage elements based on a coding scheme that distributes program disturb errors to a first of the pages and a data retention errors to a second of the pages. The one or more control circuits program each of the non-volatile storage elements to a threshold voltage range that is appropriate for the data state to which the non-volatile storage elements has been mapped.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for operating a non-volatile storage system, comprising:

accessing "n" pages of data to be programmed into a group of non-volatile storage elements, each of the non-volatile storage elements stores data in one of $2^n$ data states, each of the $2^n$ data states corresponds to a separate threshold voltage range;

mapping the "n" pages to a data state for each of the non-volatile storage elements based on a coding scheme in which read errors due to program disturb are most likely to occur when reading a first page of the "n" pages and in which read errors due to loss of data recognition are most likely to occur when reading a second page of the "n" pages; and programming each of the non-volatile storage elements in the group to a threshold voltage range in accordance with the data states to which the "n" pages have been mapped, the programming includes programming the "n" pages simultaneously.

2. The method for operating a non-volatile storage system of claim 1, wherein the program disturb and the loss of data retention are errors that are most likely to occur and second most likely to occur.

3. The method for operating a non-volatile storage system of claim 1, further comprising:

generating a separate set of ECC bits for each of the "n" pages of data, the pages of data are programmed in a first group of non-volatile storage elements; and programming each set of ECC bits in a second group of non-volatile storage elements.

4. The method for operating a non-volatile storage system of claim 3, further comprising:

sensing the first and second group of non-volatile storage elements at one or more read compare points, the one of more read compare points are associated with a first of the "n" pages, the sensing determines data bits for the first page from the first group and ECC bits for the first page from the second group;

applying an ECC algorithm by using the ECC bits for the first page and the data bits for the first page;

sensing the first and second group of non-volatile storage elements at one or more read compare points, the one of more read compare points are associated with a second of the "n" pages, the sensing determines data bits for the second page from the first group and ECC bits for the second page from the second group; and applying an ECC algorithm by using the ECC bits for the second page and the data bits for the second page.

5. The method for operating a non-volatile storage system of claim 1, wherein programming the "n" pages simultaneously includes:

performing a foggy program in which each of the non-volatile storage elements is programmed to an appropriate foggy program state for each non-volatile storage element, there is one foggy program state for each of the $2^n$ data states; and performing a fine programming in which each of the non-volatile storage elements is programmed from one of the foggy program states to the corresponding data state of the $2^n$ data states.

6. The method for operating a non-volatile storage system of claim 1, wherein the mapping the "n" pages to a data state for each of the non-volatile storage elements includes:

mapping the plurality of pages to a data state for each of the non-volatile storage elements based on a coding scheme in which a first set of read compare points are associated with a first page of the "n" pages, a second set of read compare points are associated with a second page of the "n" pages, a first read compare point is in the first set but not in the second set, a second read compare point is in the second set but not in the first set, the first and second read compare points are associated with higher error rates than the other read compare points.

7. The method of claim 1, wherein a maximum number of read compare points for reading any of the pages is "n," wherein "n" equals three.

8. The method of claim 1, further comprising reading the "n" pages in a sequence in which a first of the pages is read by reading at a single read compare point, a second of the pages is read by reading at three read compare points, and a third of the pages is read by reading at three read compare points.

9. The method of claim 1, further comprising reading the "n" pages in a sequence in which reading the "n" pages in a sequence in which a first of the pages is read by reading at two read compare points, a second of the pages is read by reading at two read compare points, and a third of the pages is read by reading at three read compare points.

10. A non-volatile storage system, comprising:

a memory array including a plurality of non-volatile storage elements; and one or more control circuits in communication with the memory array, the one or more control circuits access "n" pages of data to be programmed into a group of non-volatile storage elements, each of the non-volatile storage elements stores data in one of $2^n$ data states, each of the $2^n$ data states corresponds to a separate threshold voltage range, the one or more control circuits map the "n" pages to a data state for each of the non-volatile storage elements based on a coding scheme in which read errors due to program disturb are most likely to occur when reading a first page of the "n" pages and in which read errors due to loss of data retention are most likely to occur when reading a second page of the "n" pages, the one or more control circuits program each of the non-volatile storage elements in the group to a threshold voltage range based on the data states to which the "n" pages have been mapped, the programming includes programming the "n" pages simultaneously.

11. The non-volatile storage system of claim 10 wherein the program disturb and the loss of data retention are errors that are most likely to occur and second most likely to occur.

12. The non-volatile storage system of claim 10 wherein the one or more control circuits generate a separate set of ECC bits for each of the "n" pages of data, the pages of data are programmed in a first group of non-volatile storage elements, the one or more control circuits program each set of ECC bits in a second group of non-volatile storage elements.

13. The non-volatile storage system of claim 12, wherein the one or more control circuits sense the first and second group of non-volatile storage elements at one or more read compare points, the one of more read compare points are associated with a first of the pages, the sensing determines data bits for the first page from the first group and ECC bits for the first page from the second group, the one or more control circuits apply an ECC algorithm by using the ECC bits for the first page and the data bits for the first page, the one or more control circuits sense the first and second group of non-volatile storage elements at one or more read compare points, the one of more read compare points are associated with a second of the pages, the sensing determines data bits for the second page from the first group and ECC bits for the second page from the second group, the one or more control circuits apply an ECC algorithm by using the ECC bits for the second page and the data bits for the second page.

14. The non-volatile storage system of claim 10 wherein in order to program the "n" pages simultaneously the one or more control circuits perform a foggy program in which each of the non-volatile storage elements is programmed to an appropriate foggy program state for each non-volatile storage element, there is one foggy program state for each of the $2^n$ data states, and the one or more control circuits perform a fine programming in which each of the non-volatile storage elements is programmed from one of the foggy program states to the corresponding data state of the $2^n$ data states.

15. The non-volatile storage system of claim 10 wherein to map the "n" pages to a data state for each of the non-volatile storage elements the one or more control circuits map the "n" pages to a data state for each of the non-volatile storage elements based on a coding scheme in which a first set of read compare points are associated with a first page of the "n" pages, a second set of read compare points are associated with a second page of the "n" pages, a first read compare point is in the first set but not in the second set, a second read compare point is in the second set but not in the first set, the first and second read compare points are associated with higher error rates than the other read compare points.

16. The non-volatile storage system of claim 10 wherein a maximum number of read compare points for reading any of the pages is "n," wherein "n" equals three.

17. The non-volatile storage system of claim 10 wherein the one or more control circuits read the "n" pages in a sequence in which a first of the pages is read at a single read compare point, a second of the pages is read at three read compare points, and a third of the pages is read at three read compare points.

18. The non-volatile storage system of claim 10 wherein the one or more control circuits read the "n" pages in a sequence in which a first of the pages is read at two read compare points, a second of the pages is read at two read compare points, and a third of the pages is read at three read compare points.

19. A method for operating a non-volatile storage system, comprising:
   accessing a plurality of pages of data to be programmed into a group of non-volatile storage elements arranged as NAND strings, each of the non-volatile storage elements stores data in one of $2^n$ data states, each of the $2^n$ data states corresponds to a separate threshold voltage range;
   mapping the plurality of pages to a data state for each of the non-volatile storage elements based on a coding scheme in which read errors due to program disturb are most likely to occur when reading a first page of the plurality of pages and in which read errors due to loss of data retention are most likely to occur when reading a second page of the plurality of pages, program disturb is most likely to affect distinguishing between a first pair of the $2^n$ data states, data retention is most likely to affect distinguishing between a second pair of the $2^n$ data states;
   and
   programming each of the non-volatile storage elements to a threshold voltage range that is appropriate for the data state to which the non-volatile storage elements has been mapped.

20. The method of claim 19, wherein programming each of the non-volatile storage elements includes programming the plurality of pages simultaneously.

21. The method of claim 20, wherein programming the plurality of pages simultaneously includes:
   performing a foggy program in which each of the non-volatile storage elements is programmed to an appropriate foggy program state for each non-volatile storage element, there is one foggy program state for each of the $2^n$ data states; and
   performing a fine programming in which each of the non-volatile storage elements is programmed from one of the foggy program states to the corresponding data state of the $2^n$ data states.

22. The method of claim 19, wherein the mapping the plurality of pages to a data state for each of the non-volatile storage elements based on a coding scheme in which read errors due to program disturb are most likely to occur when reading a first page of the plurality of pages and in which read errors due to loss of data retention are most likely to occur when reading a second page of the plurality of pages includes:
   mapping the plurality of pages to a data state for each of the non-volatile storage elements based on a coding scheme in which a first set of read compare points are associated with a first page of the plurality of pages, a second set of read compare points are associated with a second page of the plurality of pages, a first read compare point is in the first set but not in the second set, a second read compare point is in the second set but not in the first set, the first and second read compare points are associated with higher error rates than the other read compare points.

23. A non-volatile storage system, comprising:
   a memory array including a plurality of non-volatile storage elements arranged as NAND strings; and
   one or more control circuits in communication with the memory array, the one or more control circuits access a plurality of pages of data to be programmed into a group of non-volatile storage elements, each of the non-volatile storage elements stores data in one of $2^n$ data states, each of the $2^n$ data states corresponds to a separate threshold voltage range, the one or more control circuits map the plurality of pages to a data state for each of the non-volatile storage elements based on a coding scheme in which read errors due to program disturb are most likely to occur when reading a first page of the plurality of pages and in which read errors due to loss of data retention are most likely to occur when reading a second page of the plurality of pages, program disturb is most likely to affect distinguishing between a first pair of the $2^n$ data states, data retention is most likely to affect distinguishing between a second pair of the $2^n$ data states, the one or more control circuits program each of the non-volatile storage elements to a threshold voltage range that is appropriate for the data state to which the non-volatile storage elements has been mapped.

24. The non-volatile storage system of claim 23 wherein to program each of the non-volatile storage elements the one or more control circuits program the plurality of pages simultaneously.

25. The non-volatile storage system of claim 24 wherein to program the plurality of pages simultaneously the one or more control circuits perform a foggy program in which each of the non-volatile storage elements is programmed to an appropriate foggy program state for each non-volatile storage element, there is one foggy program state for each of the $2^n$ data states, the one or more control circuits perform a fine programming in which each of the non-volatile storage elements is programmed from one of the foggy program states to the corresponding data state of the $2^n$ data states.

26. The non-volatile storage system of claim 23 wherein to map the plurality of pages the one or more control circuits map the plurality of pages to a data state for each of the non-volatile storage elements based on a coding scheme in which a first set of read compare points are associated with a first page of the plurality of pages, a second set of read compare points are associated with a second page of the plurality of pages, a first read compare point is in the first set but not in the second set, a second read compare point is in the second set but not in the first set, the first and second read compare points are associated with higher error rates than the other read compare points.

* * * * *